United States Patent
Liaw

(10) Patent No.: US 11,980,014 B2
(45) Date of Patent: *May 7, 2024

(54) MEMORY DEVICES WITH GATE ALL AROUND TRANSISTORS

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 23 days.

This patent is subject to a terminal disclaimer.

(21) Appl. No.: 17/168,831

(22) Filed: Feb. 5, 2021

(65) Prior Publication Data

US 2021/0159232 A1    May 27, 2021

Related U.S. Application Data

(63) Continuation of application No. 16/225,681, filed on Dec. 19, 2018, now Pat. No. 10,916,550.

(60) Provisional application No. 62/752,578, filed on Oct. 30, 2018.

(51) Int. Cl.
| | | |
|---|---|---|
| *G11C 11/412* | (2006.01) | |
| *H01L 29/06* | (2006.01) | |
| *H01L 29/10* | (2006.01) | |
| *H01L 29/78* | (2006.01) | |
| *H10B 10/00* | (2023.01) | |

(52) U.S. Cl.
CPC ............. *H10B 10/12* (2023.02); *G11C 11/412* (2013.01); *H01L 29/0673* (2013.01); *H01L 29/1033* (2013.01); *H01L 29/785* (2013.01); *H01L 2029/7858* (2013.01)

(58) Field of Classification Search
CPC .. G11C 11/41; H01L 27/1104; H01L 29/0673
USPC ........................................................ 365/154
See application file for complete search history.

(56) References Cited

U.S. PATENT DOCUMENTS

| 8,772,109 | B2 | 7/2014 | Colinge |
| 8,779,528 | B2 | 7/2014 | Liaw |
| 8,785,285 | B2 | 7/2014 | Tsai et al. |
| 8,796,666 | B1 | 8/2014 | Huang et al. |
| 8,815,712 | B2 | 8/2014 | Wan et al. |
| 8,816,444 | B2 | 8/2014 | Wann et al. |
| 8,823,065 | B2 | 9/2014 | Wang et al. |
| 8,830,732 | B2 | 9/2014 | Liaw |
| 8,860,148 | B2 | 10/2014 | Hu et al. |
| 8,963,258 | B2 | 2/2015 | Yu et al. |

(Continued)

*Primary Examiner* — Anthan Tran
(74) *Attorney, Agent, or Firm* — Haynes and Boone, LLP

(57) ABSTRACT

A memory structure and a system-on chip (SOC) device are provided. A memory structure according to the present disclosure includes a first static random access memory (SRAM) macro comprising first gate-all-around (GAA) transistors and a second SRAM macro comprising second GAA transistors. The first GAA transistors of the first SRAM macro each includes a first plurality of channel regions each having a first channel width (W1) and a first channel thickness (T1). The second GAA transistors of the second SRAM macro each comprises a second plurality of channel regions each having a second channel width (W2) and a second channel thickness (T2). W2/T2 is greater than W1/T1.

20 Claims, 10 Drawing Sheets

(56) References Cited

U.S. PATENT DOCUMENTS

| | | | |
|---|---|---|---|
| 8,964,457 B2 | 2/2015 | Liaw | |
| 9,093,530 B2 | 7/2015 | Huang et al. | |
| 9,105,490 B2 | 8/2015 | Wang et al. | |
| 9,171,929 B2 | 10/2015 | Lee et al. | |
| 9,214,555 B2 | 12/2015 | Oxland et al. | |
| 9,218,872 B1 | 12/2015 | Liaw | |
| 9,236,267 B2 | 1/2016 | De et al. | |
| 9,236,300 B2 | 1/2016 | Liaw | |
| 9,515,077 B1 * | 12/2016 | Liaw | H01L 29/0847 |
| 9,520,482 B1 | 12/2016 | Chang et al. | |
| 9,548,303 B2 | 1/2017 | Lee et al. | |
| 9,558,809 B1 * | 1/2017 | Liaw | H01L 27/0207 |
| 9,576,814 B2 | 2/2017 | Wu et al. | |
| 10,211,206 B1 | 2/2019 | Zang | |
| 10,374,099 B2 * | 8/2019 | Lee | H01L 29/42392 |
| 2013/0285116 A1 | 10/2013 | Lochtefeld et al. | |
| 2016/0078922 A1 * | 3/2016 | Liaw | H01L 29/7827 |
| | | | 365/51 |
| 2018/0308540 A1 | 10/2018 | Liaw | |
| 2018/0337189 A1 | 11/2018 | Chen et al. | |
| 2020/0411530 A1 * | 12/2020 | Wong | H01L 21/02532 |

\* cited by examiner

MEMORY DEVICES WITH GATE ALL AROUND TRANSISTORS

PRIORITY DATA

This application is a continuation application of U.S. patent application Ser. No. 16/225,681, filed Dec. 19, 2018, which claims the benefit of U.S. Provisional Application No. 62/752,578, filed Oct. 30, 2018, each of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate structure that can extend, partially or fully, around a channel region to provide access to the channel region on two or more sides. The channel region of the GAA transistor may be formed from nanowires, nanosheets, other nanostructures, and/or other suitable structures. In some implementations, such channel region includes multiple nanowires (which extend horizontally, thereby providing horizontally-oriented channels) vertically stacked. Such GAA transistor can be referred to as a vertically-stacked horizontal GAA (VGAA) transistor.

A static random access memory (SRAM) cell has become a popular storage unit of high speed communication, high-density storage, image processing and system-on-chip (SOC) products. Although existing SRAM cells have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
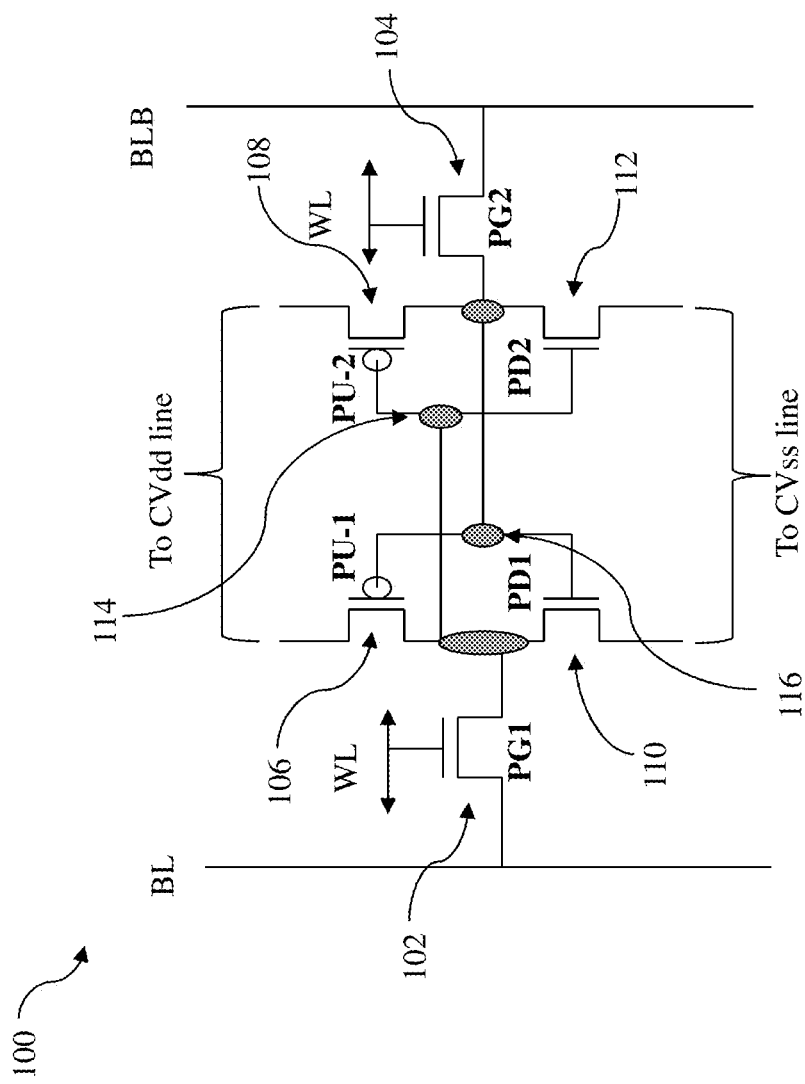
FIG. 1 illustrates a circuit diagram of an exemplary SRAM cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure relates to a memory device, and more particularly, to a structure of SRAM. A memory device or an SRAM structure according to embodiments of the present disclosure includes different types of VGAA transistors (or GAA transistors, for short). In one embodiment, the memory device includes both nanowire GAA transistors and nanosheet GAA transistors. The nanowire GAA transistors have small cylindrical channel regions to provide the memory device with low leakage and low power consumption while the nanosheet transistors have wider sheet-like channel regions to provide the memory device with high speed. The following disclosure will continue with example SRAM cells and SRAM macros to illustrate various embodiments of the present disclosure. In these example SRAM cells and SRAM macros, each GAA transistor includes one vertical stack of nanowires or nanosheets. It should be understood, however, that the present disclosure is not limited to such example SRAM cells and macros, but also includes those that include GAA transistors having more than one stacks of nanowires or nanosheets.

FIG. 1 illustrates a circuit diagram of an SRAM cell 100 in accordance with some embodiments of the present disclosure. The SRAM cell 100 includes six (6) transistors (6T) and allows single read/write at a time. In some instances, the SRAM cell 100 in FIG. 1 may also be referred to a single-port SRAM cell. It is noted, even though the embodiments of the present disclosure are described along with 6T single-port SRAM cells, the present disclosure is not so limited. The present disclosure may be applicable to SRAM cells consisting of more transistors, such as 7T, 8T, 9T, or 10T, that may be single-port, dual-port, or multi-port. The SRAM cell 100 includes first and second pass-gate nodes 102 (PG-1) and 104 (PG-2), first and second pull-up nodes 106 (PU-1) and 108 (PU-2), and first and second pull-down nodes 110 (PD-1) and 112 (PD-2). In SRAM cell 100, each of the pass-gate nodes, pull-up nodes and pull-down nodes may be a transistor, such as a GAA transistor. The gates of the first and second pass-gate nodes 102 and 104 are electrically coupled to word-line (WL) that determines whether the SRAM cell 100 is selected or not. In the SRAM cell 100, a memory bit (e.g., a latch or a flip-flop) is formed of the first and second pull-up nodes 106 and 108 and the first and second pull-down nodes 110 and 112 to store a bit of data. The complementary values of the bit are stored in the storage node 114 and the storage node 116. The stored bit can be written into, or read from, the SRAM cell 100 through Bit-line (BL) and Bit-Line Bar (BLB). In this arrangement, the BL and BLB may carry complementary bit-line signals. The SRAM cell 100 is powered through a positive power supply node CVdd that has a positive power supply voltage and is also connected to a power supply voltage CVss, which may be an electrical ground.

In SRAM cell 100 in FIG. 1, the sources of the first and second pull-up nodes 106 and 108 are connected to CVdd. The sources of the first and second pull-down nodes 110 and 112 are connected to CVss. The gates of the first pull-up node 106 and the first pull-down node 110 are connected to the drains of the second pull-up node 108 and the second pull-down node 112 at the storage node 114. The gates of the second pull-up node 108 and the second pull-down node 112 are connected to the drains of the first pull-up node 106 and the first pull-down node 110 at the storage node 116. A source/drain region of the first pass-gate node 102 is connected to Bit-line (BL). A source/drain region of the second pass-gate node 104 is connected to Bit-line bar (BLB). The SRAM cell 100 shown in FIG. 1 may be implemented in a first type of SRAM cell in FIG. 2 (also shown in FIGS. 2A, 2B and 2C) and a second type of SRAM cell in FIG. 3 (also shown in FIG. 3A).

Figure 2:
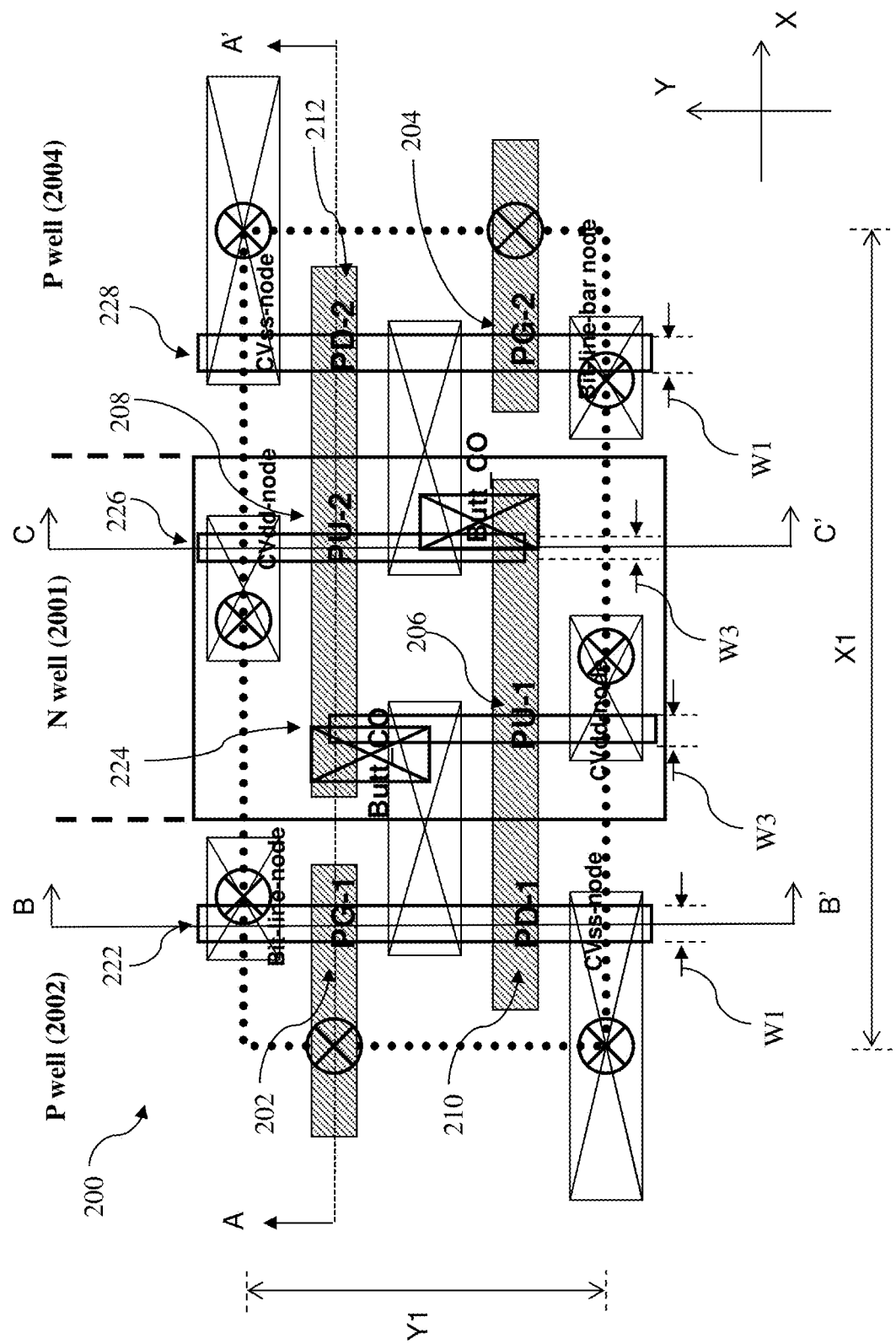
FIG. 2 illustrates a layout of a first type of SRAM cell in accordance with some embodiments of the present disclosure.

Referring now to FIG. 2, shown therein is a layout of a first type SRAM cell 200 in accordance with some embodiments of the present disclosure. Similar to SRAM cell 100, the first type of SRAM cell 200 includes six (6) transistors functioning as the first pass-gate node 202, the second pass-gate node 204, the first pull-up node 206, the second pull-up node 208, the first pull-down node 210, and the second pull down node 212. In some implementations as illustrated in FIG. 2, the first type SRAM cell 200 is formed over an N-type well 2001 (or N-type region 2001, N well 2001) sandwiched between two P-type wells 2002 and 2004 (or P-type regions 2002 and 2004, P wells 2002 and 2004). The N well 2001 and P wells 2002, 2004 are formed over a substrate or a wafer. In some embodiments, as shown in FIG. 2, the first pass-gate node 202, the first pull-down node 210, the second pull-down node 212, and the second pass-gate node 204 may be formed in the P wells 2002 and 2004; and the first pull-up node 206 and the second pull-up node 208 are formed in the N well 2001. In these embodiments, the first pass-gate node 202, the first pull-down node 210, the second pull-down node 212, and the second pass-gate node 204 are N-type nanowire GAA transistors; and the first pull-up node 206 and the second pull-up node 208 are P-type nanowire GAA transistors.

In some alternative implementations not illustrated in FIG. 2, the first type SRAM cell 200 is formed over a P well sandwiched between two N wells. In those implementations, the first and second pass-gate nodes and the first and second pull-down nodes are formed in the N wells and the first and second pull-up nodes are formed in the P well between the two N wells. Also in those implementations, the first and second pass-gate nodes and the first and second pull-down nodes are P-type nanowire GAA transistors; and the first and second pull-up nodes are N-type nanowire GAA transistors.

In some embodiments, the first type SRAM cell 200 includes four nanowire stacks 222, 224, 226, and 228. The nanowire stack 222 is formed over the P well 2002 and forms the channel regions of the first pass-gate node 202 and the first pull-down node 210. The nanowire stack 224 and the nanowire stack 226 are formed over the N well 2001 and form the channel regions of the first pull-up node 206 and the second pull-up node 208, respectively. The nanowire stack 228 is formed over the P well 2004 and forms the channel regions of the second pull-down node 212 and the second pass-gate node 204. In some implementations, each of the nanowire stacks 222, 224, 226, and 228 may include at least two (2) nanowires, such as three (3), four (4), five (5) nanowires.

In some instances, the nanowire stacks can be formed by depositing or epitaxially growing alternating layers of two different semiconductor materials, recessing the alternative layers to form a fin-like structure, and selectively removing layers formed of one of the two semiconductor materials. For example, alternating layers of epitaxially grown silicon (Si) and germanium (Ge) can be formed on a substrate. The alternating layers may then be recessed to form fin-like structures that consist of stacks of interleaved Si strips and Ge stripes. These fin-like structures are separated by shallow trench isolation (STI) features. In processes to form a channel region of a transistor in a SRAM cell, depending on the conductivity type of the transistor, the channel region of the fin-like structures may undergo different etching processes to selectively remove the Si strips or the Ge strips, leaving behind Si nanowires or Ge nanowires extending between the source/drain regions. In some embodiments, the nanowires may be doped, either in-situ during epitaxial growing or by implantation.

Figure 2A:
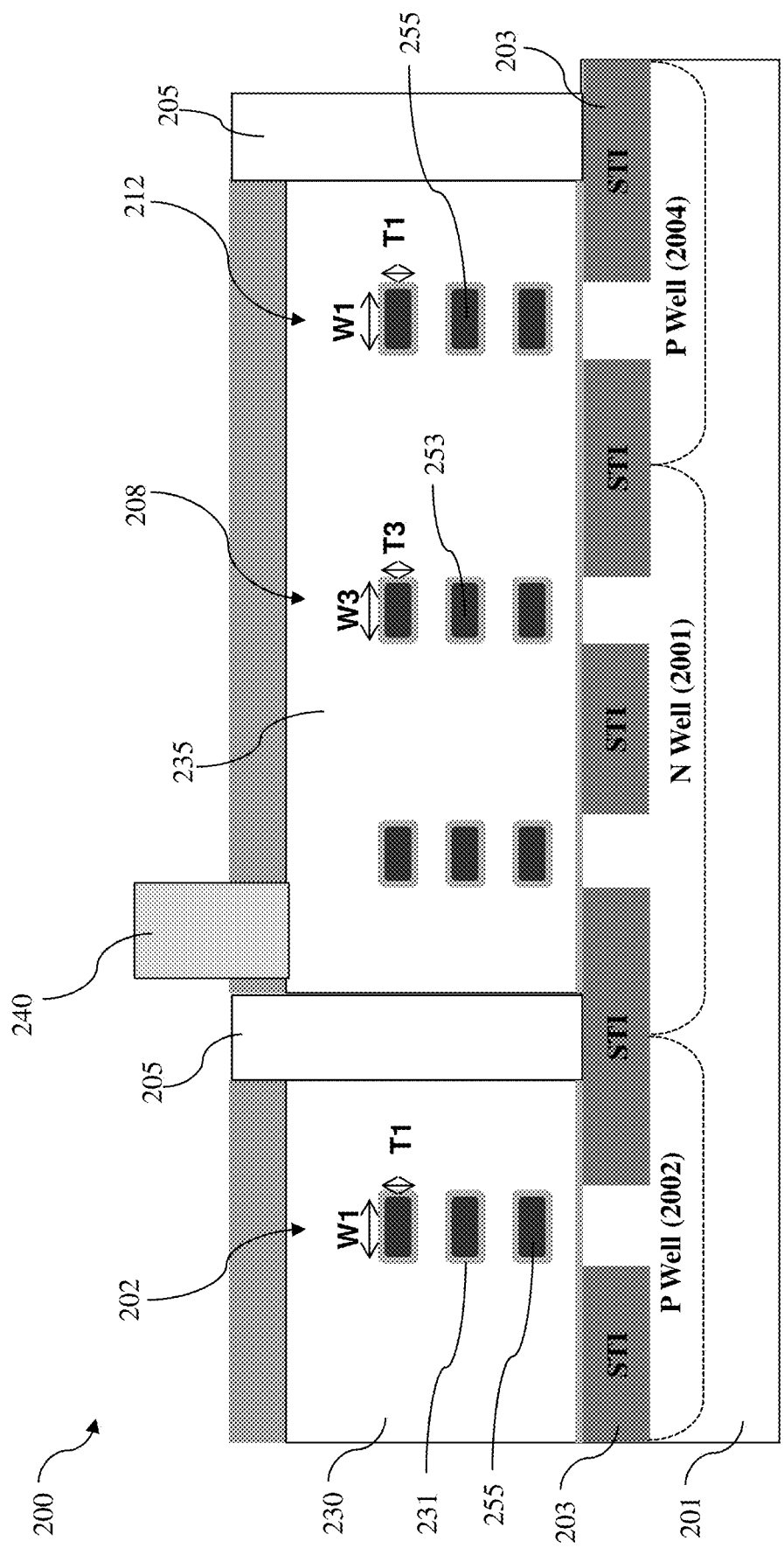
FIG. 2A illustrates a cross-sectional view of the layout in FIG. 2 along line A-A'.

Reference is now made to FIG. 2A, which illustrates a cross-sectional view of the first type SRAM cell 200 in FIG. 2 along line A-A'. As shown in FIG. 2A, the first pass-gate node 202 includes a vertical stack of nanowires over a substrate 201; the second pull-up node 208 includes a vertical stack of nanowires over the substrate 201; and the second pull-down node 212 includes a vertical stack of nanowires over the substrate 201. Each of these vertical stacks of nanowires may include a base region that is separated from an adjacent base region by a shallow trench isolation (STI) region 203. Each of the nanowires of the first pass-gate node 202, the second pull-up node 208 and the second pull-down node 212 is surrounded by a gate dielectric 231 in the channel regions. The gate dielectric 231 may include one or more dielectric layers. Line A-A' passes through gate structures 230 and 235 that are formed over and around the nanowires in the channel region of the first pass-gate node 202, the nanowires in the channel region of the second pull-up node 208, and the nanowires in the channel region of the second pull-down node 212. In addition, the cross-sectional view in FIG. 2A shows cross sections of gate end dielectrics 205 and a gate contact 240. A gate end dielectric 205 may either be disposed between gate structures, or at an end of a gate structure after a gate cut process. In some embodiments, each of the nanowires 255 in the channel regions of the first pass-gate node 202 and the second pull-down node 212 may be of substantially the same size and have a width W1 along the gate direction (i.e. the direction along which gate structure 230 extends) and a thickness T1. While not shown in FIG. 2A, each of the nanowires in the channel regions of the second pass-gate node 204 and the first pull-down node 210 may be of substantially the same size and have the width W1 and the thickness T1. Each of the nanowires 253 in the channel regions of the second pull-up node 208 may have a width W3 along the gate direction and a thickness T3. Although not shown in FIG. 2A, each of the nanowires in the channel region of the first pull-up node 206 may also have the same width W3 and the thickness T3. In some implementations, a ratio of W1 over T1 (W1/T1) is between about 0.9 and about 2.0. In some embodiments, a ratio of W1 over W3 (W1/W3) may be about 1.0, such as between about 0.9 and about 1.1. In some implementations, T1 is substantially identical to T3. In some other embodiments, in order to avoid adopting write assist features in SRAM driving logic, the width W1 of the channel regions of the first and second pass-gate nodes 202 and 204 and the first and second pull-down node 210 and 212 are wider than the width W3 of the channel regions of the first and second pull-up nodes 206 and 208 by about 10% to about 50%. That is, in those embodiments, a ratio of W1 over W3 (W1/W3) may be between about 1.1 and about 1.5.

The cross-sectional view along a line that passes the first pull-down node 210, the first pull-up node 206, and the second pass-gate node 204 of the first type SRAM cell 200 are similar to the cross-sectional view along line A-A' and is not repeated here.

Figure 2C:
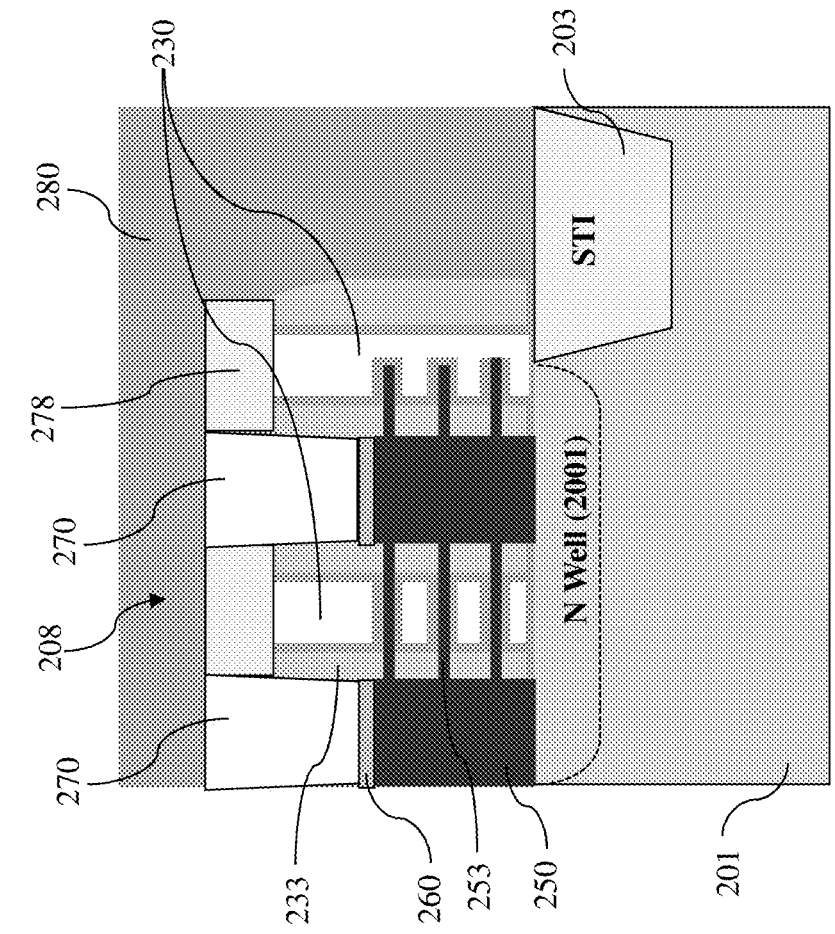
FIG. 2C illustrates a cross-sectional view of the layout in FIG. 2 along line C-C'.
Figure 2B:
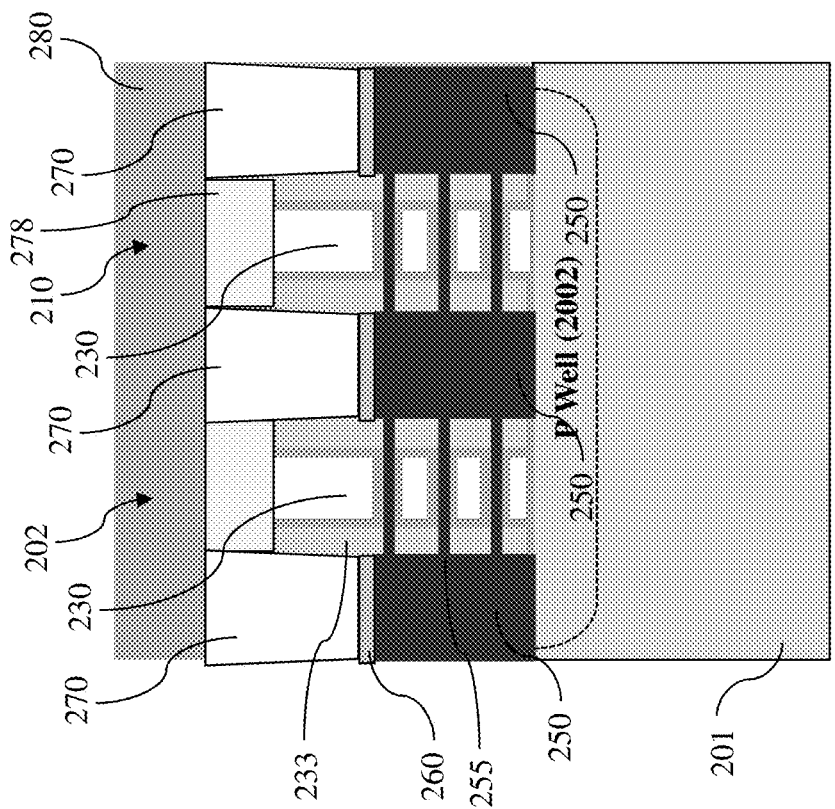
FIG. 2B illustrates a cross-sectional view of the layout in FIG. 2 along line B-B'.

Referring now to FIG. 2B, illustrated therein is a cross-sectional view of the first type SRAM cell 200 in FIG. 2. As shown in FIG. 2B, line B-B' passes through the source/drain regions 250 and channel regions 255 of the first pass-gate node 202 and the first pull-down node 210. The gate structures 230 may be protected and lined by gate spacers 233 over sidewalls of the gate structures 230. In addition, in some embodiments represented in FIG. 2B, the gate structure 230 may be capped and protected by a hard mask layer 278. The source/drain regions 250 may be electrically coupled to source/drain contacts 270 via silicide layers 260. In some implementations, top surfaces of the source/drain contacts 270 and the hard mask layers 278 may be planarized by, for example, etching, grinding or chemical mechanical polishing (CMP). A dielectric layer 280 may be formed over the planarized source/drain contacts 270 and hard mask layers 278.

Referring now to FIG. 2C, illustrated therein is a cross-sectional view of the first type SRAM cell 200 in FIG. 2 along line C-C'. As shown in FIG. 2C, line C-C' passes through the source/drain regions 250 and channel regions 253 of the second pull-up node 208. The gate structures 230 may be protected and lined by gate spacers 233 over sidewalls of the gate structures 230. In addition, in some embodiments represented in FIG. 2C, the gate structure 230 may be capped and protected by a hard mask layer 278. The source/drain regions 250 may be electrically coupled to source/drain contacts 270 via silicide layers 260. In some implementations, top surfaces of the source/drain contacts 270 and the hard mask layers 278 may be planarized by, for example, etching, grinding or CMP. The dielectric layer 280 may be formed over the planarized source/drain contacts 270 and hard mask layers 278.

Figure 3:
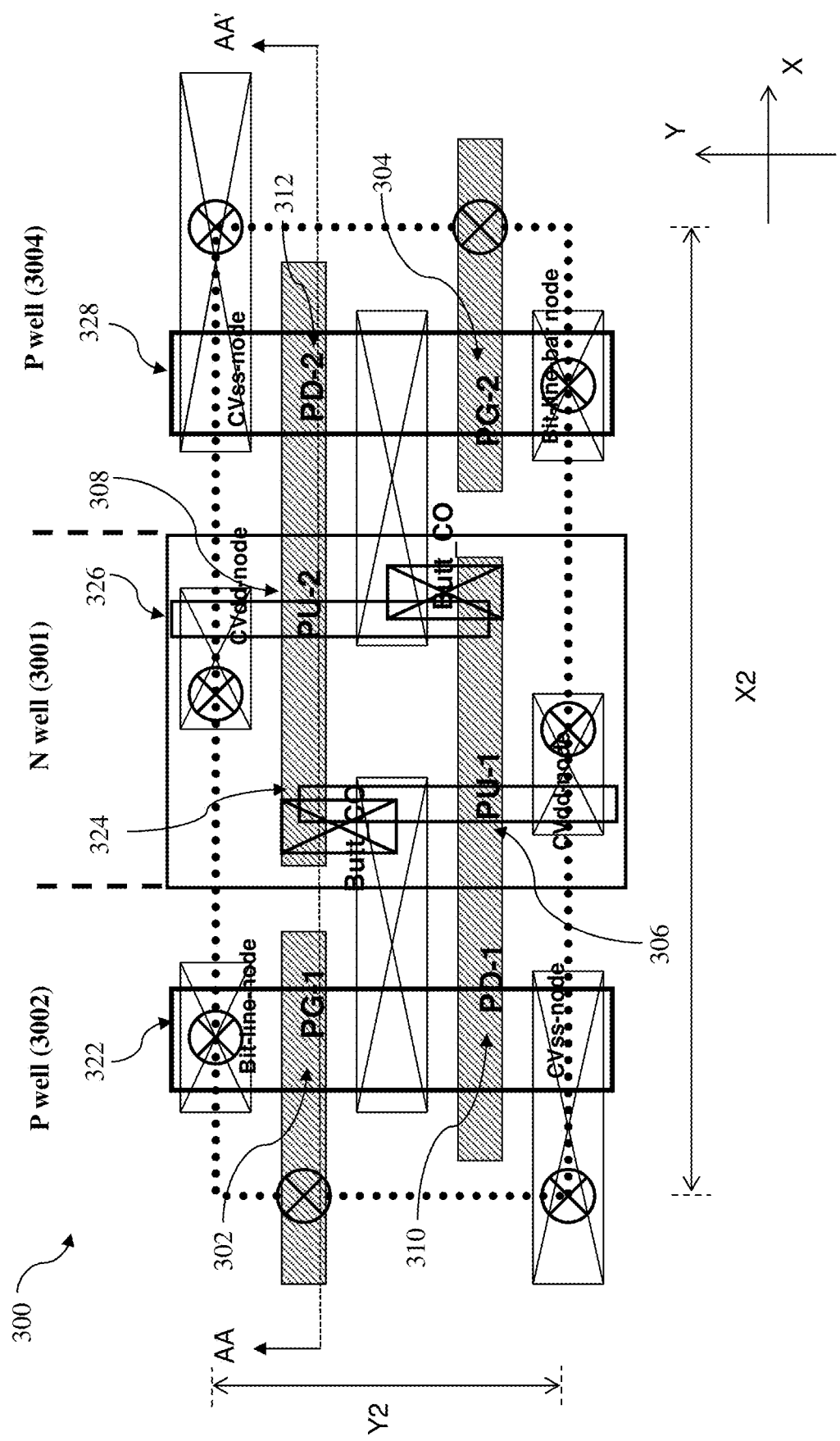
FIG. 3 illustrates a layout of a second type of SRAM cell in accordance with some embodiments of the present disclosure.

Referring now to FIG. 3, shown therein is a layout of a second type SRAM cell 300 in accordance with some embodiments of the present disclosure. Similar to SRAM cell 100, the second type SRAM cell 300 includes six (6) transistors functioning as the first pass-gate node 302, the second pass-gate node 304, the first pull-up node 306, the second pull-up node 308, the first pull-down node 310, and the second pull-down node 312. In some implementations as illustrated in FIG. 3, the second type SRAM cell 300 is formed over an N-type well 3001 (or N-type region 3001, N well 3001) sandwiched between two P-type wells 3002 and 3004 (or P-type regions 3002 and 3004, P wells 3002 and 3004). The N well 3001 and P wells 3002, 3004 are formed over a substrate or a wafer. In some embodiments, as shown in FIG. 3, the first pass-gate node 302, the first pull-down node 310, the second pull-down node 312, and the second pass-gate node 304 may be formed in the P wells 3002 and 3004; and the first pull-up node 306 and the second pull-up node 308 are formed in the N well 3001. In these embodiments, the first pass-gate node 302, the first pull-down node 310, the second pull-down node 312, and the second pass-gate node 304 may be N-type nanosheet GAA transistors; and the first pull-up node 306 and the second pull-up node 308 maybe P-type nanowire GAA transistors.

In some alternative implementations not illustrated in FIG. 3, the second type SRAM cell 300 is formed over a P well sandwiched between two N wells. In those implementations, the first and second pass-gate nodes and the first and second pull-down nodes are formed in the N wells and the first and second pull-up nodes are formed in the P well between the two N wells. Also in those implementations, the first and second pass-gate nodes and the first and second pull-down nodes are P-type nanosheet GAA transistors; and the first and second pull-up nodes are N-type nanowire GAA transistors.

In some embodiments, the second type SRAM cell 300 includes two nanosheet stacks 322 and 328 and two nanowire stacks 324 and 326. The nanosheet stack 322 is formed over the P well 3002 and forms the channel regions of the first pass-gate node 302 and the first pull-down node 310. The nanowire stack 324 and the nanowire stack 326 are formed over the N well 3001 and form the channel regions of the first pull-up node 306 and the second pull-up node 308, respectively. The nanosheet stack 328 is formed over the P well 3004 and forms the channel regions of the second pull-down node 312 and the second pass-gate node 304. In some implementations, each of the nanosheet stacks 322 and 328 may include at least two (2) nanosheets, such as three (3), four (4), five (5) nanosheets; and each of the nanowire stacks 324 and 326 may include at least two (2) nanowires, such as three (3), four (4), five (5) nanowires.

In some instances, both the nanowire stacks and the nanosheet stacks can be formed by depositing or epitaxially growing alternating layers of two different semiconductor materials, recessing the alternative layers to form a fin-like structure, and selectively removing layers formed of one of the two semiconductor materials. The fin-like structures for nanosheet stacks are wider than the fin-like structures for nanowire stacks. These fin-like structures are separated by shallow trench isolation (STI) features. For example, alternating layers of epitaxially grown silicon (Si) and germanium (Ge) can be formed on a substrate. The alternating layers may then be recessed to form fin-like structures that are stacks of Si strips and Ge stripes. In processes to form a channel region of a transistor in a SRAM cell, depending on the conductivity type of the transistor, the channel region of the fin-like structures may undergo different etching processes to selectively remove the Si strips or the Ge strips, leaving behind Si nanowires/nanosheets or Ge nanowires/nanosheets extending between the source/drain regions. In some embodiments, the nanowires/nanosheets may be doped, either in-situ during epitaxial growing or by implantation.

Figure 3A:
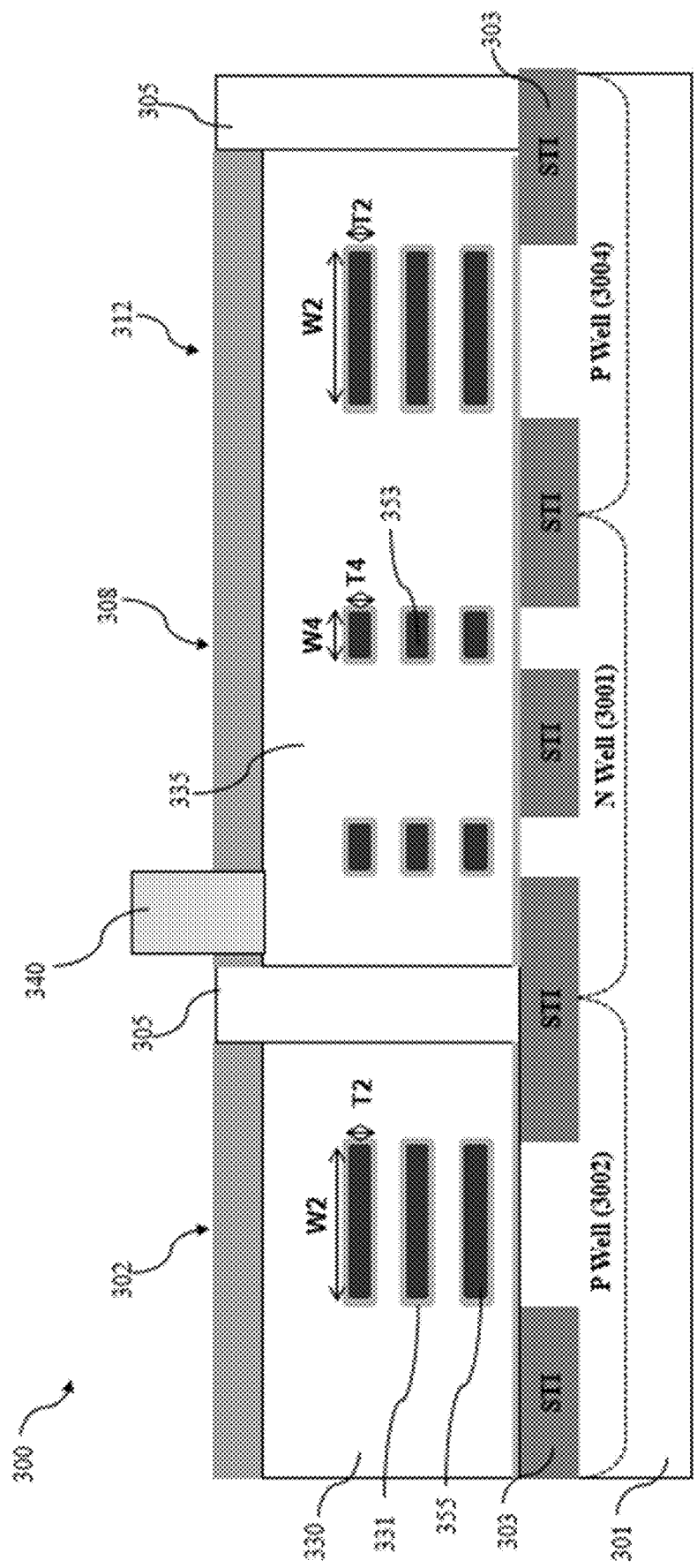
FIG. 3A illustrates a cross-sectional view of the layout in FIG. 3 along line AA-AA'.

Reference is now made to FIG. 3A, which illustrates a cross-sectional view of the second type SRAM cell 300 in FIG. 3 along line AA-AA'. As shown in FIG. 3A, the first pass-gate node 302 includes a vertical stack of nanosheets over a substrate 301; the second pull-up node 308 includes a vertical stack of nanowires over the substrate 301; and the second pull-down node 312 includes a vertical stack of nanosheets over the substrate 301. Each of these vertical stacks of nanowires/nanosheets may include a base region that is separated from an adjacent base region by a shallow trench isolation (STI) region 303. Each of the nanosheets of the first pass-gate node 302 and the second pull-down node 312 and each of the nanowires of the second pull-up node 308 is surrounded by a gate dielectric 331 in the channel regions. The gate dielectric 331 may include one or more dielectric layers. Line AA-AA' passes through gate structures 330 and 335 that are formed over and around the nanosheets in the channel region of the first pass-gate node 302, the nanowires in the channel region of the second pull-up node 308, and the nanosheets in the channel region of the second pull-down node 312. In addition, the cross-sectional view in FIG. 3A shows cross sections of gate end dielectrics 305 and a cross section of a gate contact 340. A gate end dielectric 305 may either be disposed between gate structures or at an end of a gate structure after a gate cut process. In some embodiments, each of the nanosheets 355 in the channel regions of the first pass-gate node 302 and the second pull-down node 312 may be of substantially the same size and have a width W2 along the gate direction (i.e. the direction along which gate structure 330 extends) and a thickness T2. While not shown in FIG. 3A, each of the nanosheets in the channel regions of the second pass-gate node 304 and the first pull-down node 310 may be of substantially the same size and have the width W2 and the thickness T2. Each of the nanowires 353 in the channel regions of the second pull-up node 308 may have a width W4 along the gate direction and a thickness T4. Although not shown in FIG. 3A, each of the nanowires in the channel region of the first pull-up node 306 may also have the same width W4 and the thickness T4. In some implementations, a ratio of W2 over T2 (W2/T2) is between about 2.0 and about 10.0 and a ratio of W4 over T4 (W4/T4) is between about 0.9 and about 2.0. In some embodiments, a ratio of W2 over W4 (W2/W4) may be about 1.2 and about 5.0, such as between about 1.4 and about 3.0. In some implementations, T2 is substantially identical to T4.

The cross-sectional view along a line that passes the first pull-down node 310, the first pull-up node 306, and the second pass-gate node 304 of the second type SRAM cell 300 are similar to the cross-sectional view along line AA-AA' and is not repeated here.

Figure 4:
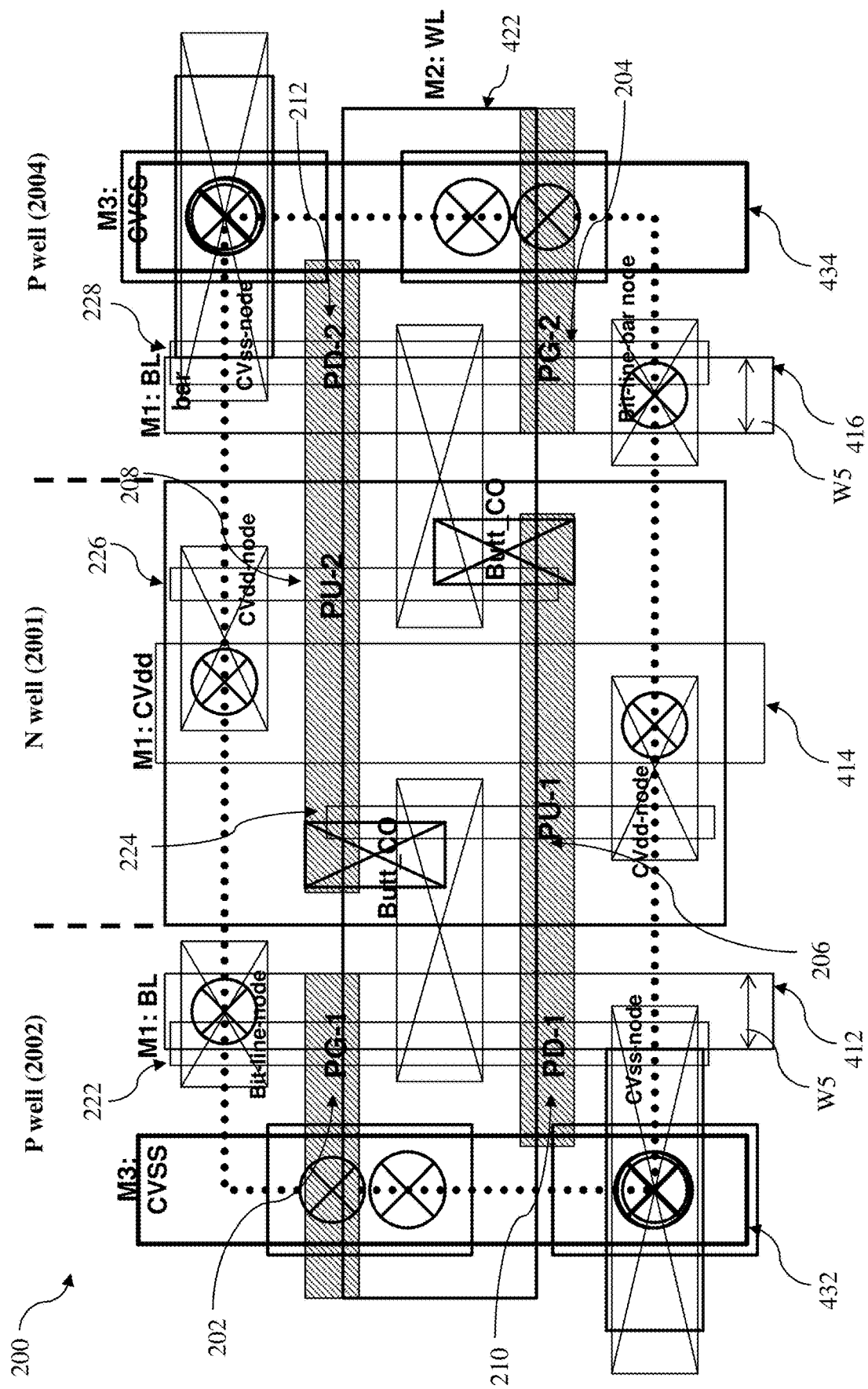
FIG. 4 illustrates a layout of the first type of SRAM cell in FIG. 2, along with metal layers.

Reference is now made to FIG. 4, which illustrate metallization or metal line layers formed over the first type SRAM cell 200. As illustrated in FIG. 4, a bit line 412 is formed over the first pass-gate node 202 and the first pull-down node 210 and a bit line 416 is formed over the second pull-down node 212 and the second pass-gate node 204. Additionally, a CVdd line 414 is formed over contacts to source/drain regions for the first pull-up node 206 and the second pull-up node 208. The bit lines 412 and 416 as well as the CVdd line 414 are in the first metal layer M1. A CVss line 432 is formed over a contact to the source/drain region of the first pull-down node 210. A CVss line 434 is formed over a contact to the source/drain region of the second pull-down node 212. The two CVss lines 432 and 434 are in the third metal layer M3. The word line WL 422 is electrically coupled to the gate structures for the first pass-gate node 202 and the second pass-gate node 204. The word line WL 422 is situated in the second metal layer M2. In some embodiments, the bit lines 412 and 416 have a width W5.

Figure 5:
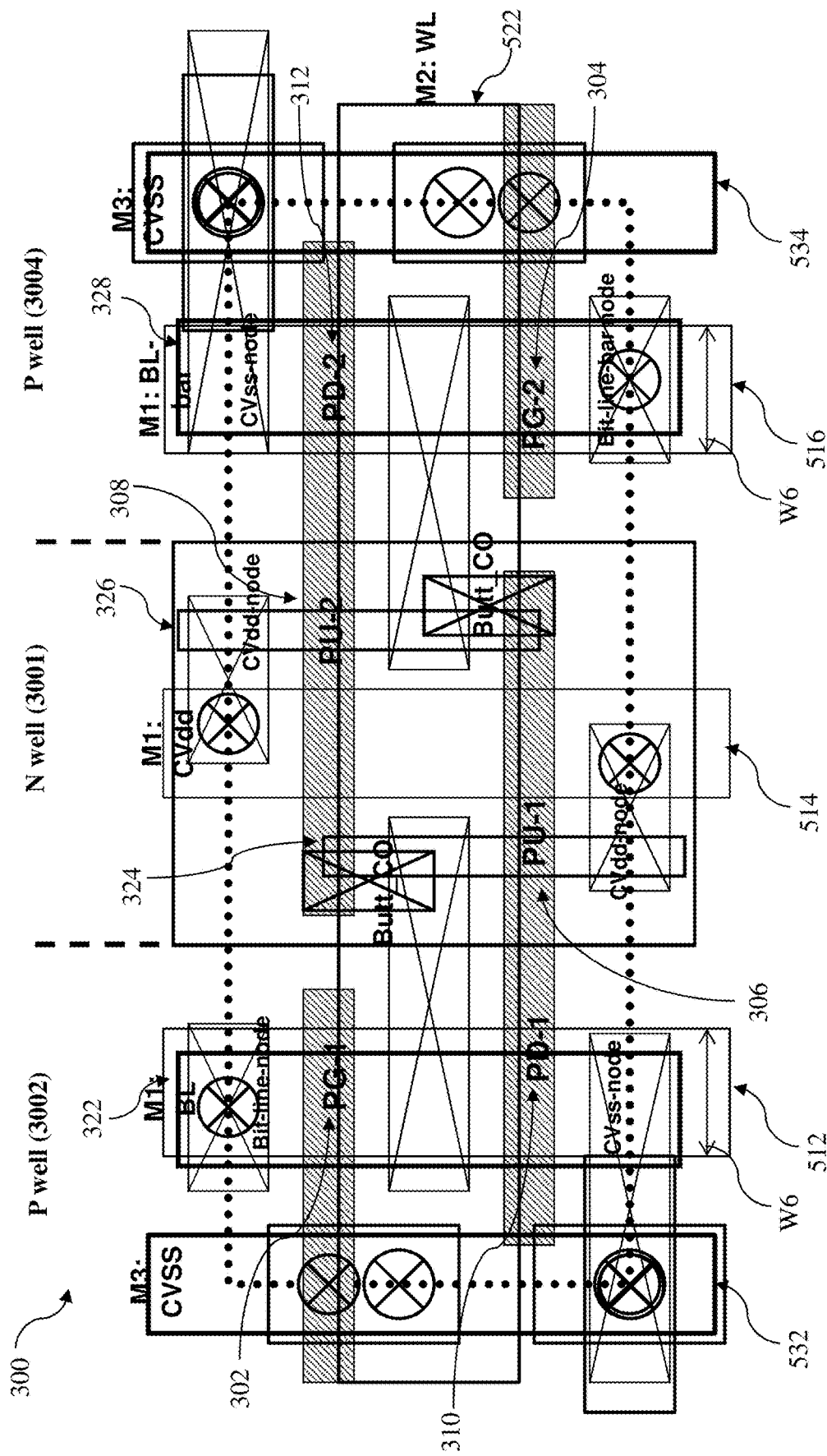
FIG. 5 illustrates a layout of the second type of SRAM cell in FIG. 3, along with metal layers.

Reference is now made to FIG. 5, which illustrate metallization or metal line layers formed over the second type SRAM cell 300. As illustrated in FIG. 5, a bit line 512 is formed over the first pass-gate node 302 and the first pull-down node 310 and a bit line 516 is formed over the second pull-down node 312 and the second pass-gate node 304. Additionally, a CVdd line 514 is formed over contacts to source/drain regions for the first pull-up node 306 and the second pull-up node 308. The bit lines 512 and 516 as well as the CVdd line 514 are in the first metal layer M1. A CVss line 532 is formed over a contact to the source/drain region of the first pull-down node 310. A CVss line 534 is formed over a contact to the source/drain region of the second pull-down node 312. The two CVss lines 532 and 534 are in the third metal layer M3. The word line WL 522 is electrically coupled to the gate structures for the first pass-gate node 302 and the second pass-gate node 304. The word line WL 522 is situated in the second metal layer M2. In some embodiments, the bit lines 512 and 516 have a width W6. In some embodiments, to reduce resistance and increase speed, the bit lines 512 and 516 are wider. If the first type SRAM cell 200 is to be compared to the second type SRAM cell 300, W6 is greater than W5. In some implementations, W6 is about 20% to about 30% greater than W5. In other words, in those implementations, W6 is about 1.2 times to about 1.3 times of W5.

In some instances, a plurality of SRAM cells can be connected together to form SRAM macros. For example, a 32 by 32 (32×32) array of SRAM cells can constitute a 1K bit SRAM marco and a 256 by 32 (256×32) array of SRAM cells can form an 8K bit SRAM macro. For modern day system-on-chip (SOC) applications, multiple levels of memories may be embedded in the SOC chip along with a processor, such as a central processing unit (CPU) or a graphics processing unit (GPU). In some instances, the embedded memories are fabricated along with the processor on one substrate or wafer. In some implementations, there can be three levels of memories or caches—the first level (L1), the second level (L2), and the third level (L3), with the first level (L1) connectively closer to the processor and the third level (L3) connectively farther away from the processor. In these implementations, L1 caches require high speed, which usually mean the L1 caches have speed substantially identical to the speed of the processor. The L2 cache can be slower than the first level L1 cache. The L3 cache can be slower than the second level L2 cache. According to embodiments of the present disclosure, the high speed of the second type SRAM cells 300 is a result of the nanosheet GAA transistors in the pull-down and pass-gate nodes and optionally, the wider width of the bit lines. The use of nanosheet GAA transistors and wider bit lines increases a width of the second type SRAM cell 300 and a pitch at which the second type SRAM cell 300 are packed in a macro. That is, in terms of SRAM cells of the present disclosure, speed may come at the cost of density. If speed and density of the three levels of memories are considered together, the first level L1 caches can be a macro formed of the second type SRAM cells 300, the third level L3 caches can be a macro formed of the first type SRAM cells 200, and the second level L2 caches can be a macro formed of both the first type SRAM cells 200 and the second type SRAM cells 300.

Reference is now made to FIG. 2 and FIG. 3. In some implementations, the first type SRAM cell 200 in FIG. 2 includes a first X pitch (X1) along the X direction and a first Y pitch (Y1) along the Y direction; and the second type SRAM cell 300 in FIG. 3 includes a second X pitch (X2) along the X direction and a second Y pitch (Y2) along the Y direction. In some implementations, Y1 is substantially equal to Y2 while X2 is at least 5% greater than X1.

In some embodiments, a write assist circuitry may be included in a peripheral circuit of an SRAM cell to improve write margin (WM) or write noise margin (WNM). In some implementation, the write assist circuitry may assist writing of an SRAM cell by having negative bit lines, raising Vss, reducing Vdd, or boosting word line (WL). In some embodiments of the present disclosure, a write assist circuitry may be included in a first peripheral circuit of the first type SRAM cells 200 or a macro consisting of the first type SRAM cells 200. In these embodiments, such write assist circuitry is not included in or omitted from a second peripheral circuit of the second type SRAM cells 300 or a macro consisting of the second type SRAM cells 300. Such omission is at least made possible by either the wider nanosheet channels in the second type SRAM cells 300 or the wider bit lines in the second type SRAM cells 300, or both. As described above, the width W2 of the nano sheet channels in the second type SRAM cell 300 is about 1.2 to about 5.0 times, such as about 1.4 to about 3.0 times, of the width W1 of the nanowire channels in the first SRAM cell 200. In some instances, in addition to inclusion of nanosheet GAA transistors with wider channels, the second type SRAM cell 300 may also bit lines (such as bit lines 512 and 516) of the width W6 that is greater than the width W5 of the bit lines (such as bit lines 412 and 416) of the first type SRAM cell 200. As described above in conjunction with FIGS. 4 and 5, W6/W5 is between about 1.2 and about 1.3.

Figure 6:
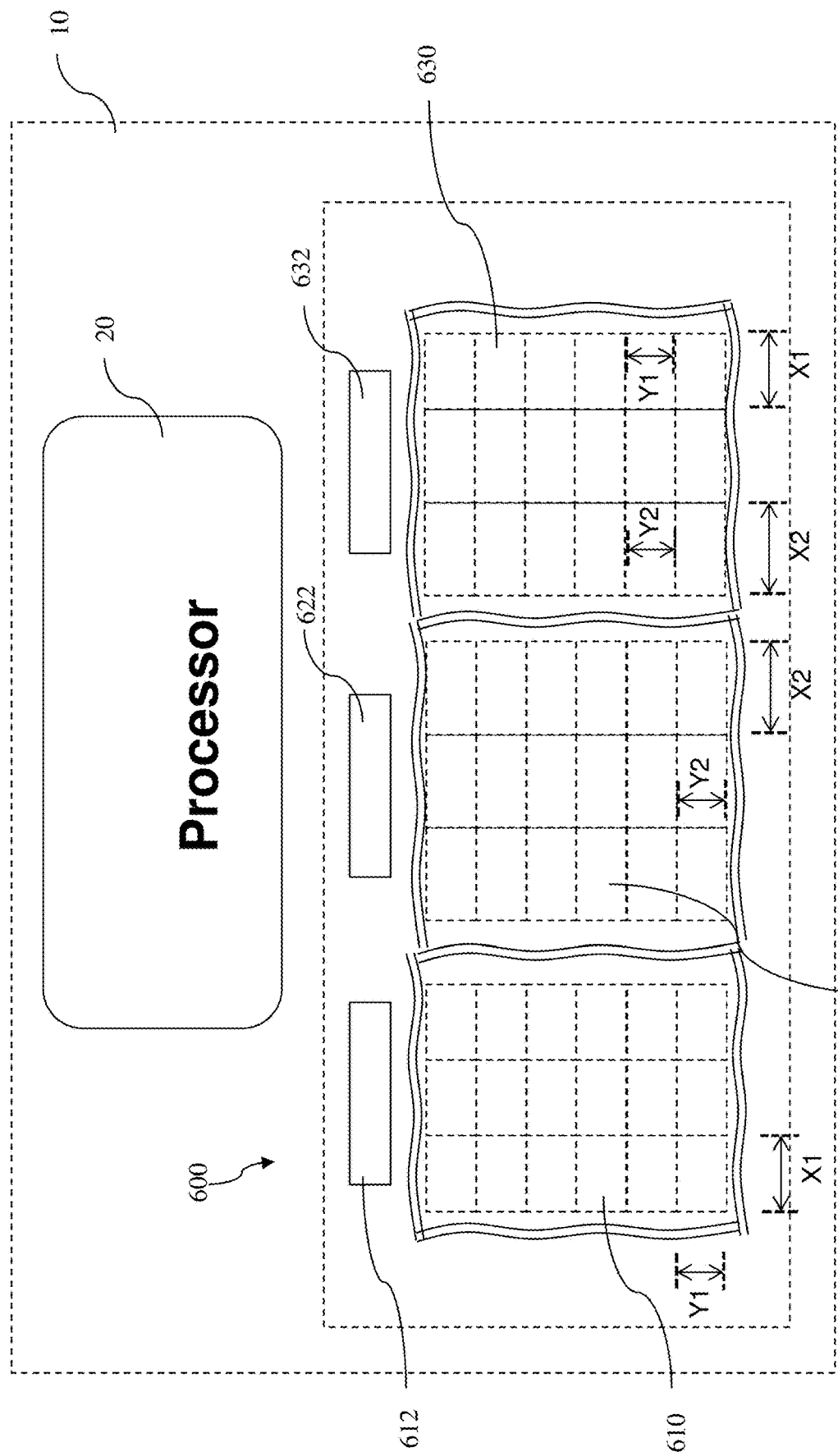
FIG. 6 is a schematic diagram of an embedded memory structure according to embodiments of the present disclosure.

FIG. 6 is a schematic diagram of an embedded memory structure 600 in an SOC 10 or a processor 20. The processor 20 may be a CPU, a GPU, or the like, that requires high speed operation. Which FIG. 6 only shows the embedded memory structure 600 and a processor 20, the SOC 10 may include other components, such as a storage component, another processor, an ASIC, and an I/O controller. The embedded memory structure 600 includes a first macro 610 consisting of the first type SRAM cells, such as the first type SRAM cells 200 in FIG. 2 and a second macro 620 consisting of the second type SRAM cells, such as the second type SRAM cells 300 in FIG. 3. Also illustrated in FIG. 6, the embedded memory structure 600 may include a third macro 630 that include both the first type SRAM cells and the second type SRAM cells. The first macro 610, second macro 620 and the third macro 630 are connected and accessible to the processor 20. In some instances, the first macro 610, second macro 620 and the third macro 630 are embedded in the processor 20. In some embodiments, the first macro 610 may serve as the L3 cache, the second macro 620 may serve as the L1 cache, and the third macro 630 may serve as the L2 cache.

Still referring to FIG. 6, each the first type SRAM cells 200 has the first X pitch X1 and the first Y pitch Y1 and each of the second type SRAM cells 300 has the second X pitch X2 and the second Y pitch Y2. As the second type SRAM cells 300 include nanosheet GAA transistors, X2 is greater than X1. In some instances, X2 is at least 1.05 times of X1. Y1 is substantially identical to Y2. In addition, because the third macro 630 includes a combination of the first type SRAM cells 200 and the second type SRAM cells 300, a portion of the third macro 630 may be featured by the first X pitch X1 and another portion of the third macro 630 may be featured by the second X pitch X2. Although the third macro 630 is illustrated in FIG. 6 as having a column of the first type SRAM cells 200 immediately adjacent another column of the second type SRAM cells 300, the present disclosure is not so limited. Other arrangements and configurations of the first type SRAM cells 200 and the second type SRAM cells 300 in the third macro 630 are fully envisioned by the present disclosure.

In some embodiments, the embedded memory structure 600 may include a peripheral circuit. In the implementations represented by FIG. 6, the embedded memory structure 600 includes a first peripheral circuit 612 to control the first macro 610, a second peripheral circuit 622 to control the second macro 620, and a third peripheral circuit 632 to control the third macro 630. In some instances, as described above, the first peripheral circuit 612 includes write assist circuitry while the second peripheral circuit 622 does not include any write assist circuitry. The third peripheral circuit 632 may include the write assist circuitry because the third peripheral circuit 632 is to control read/write of the first type SRAM cells 200 in the third macro 630.

Figure 7:
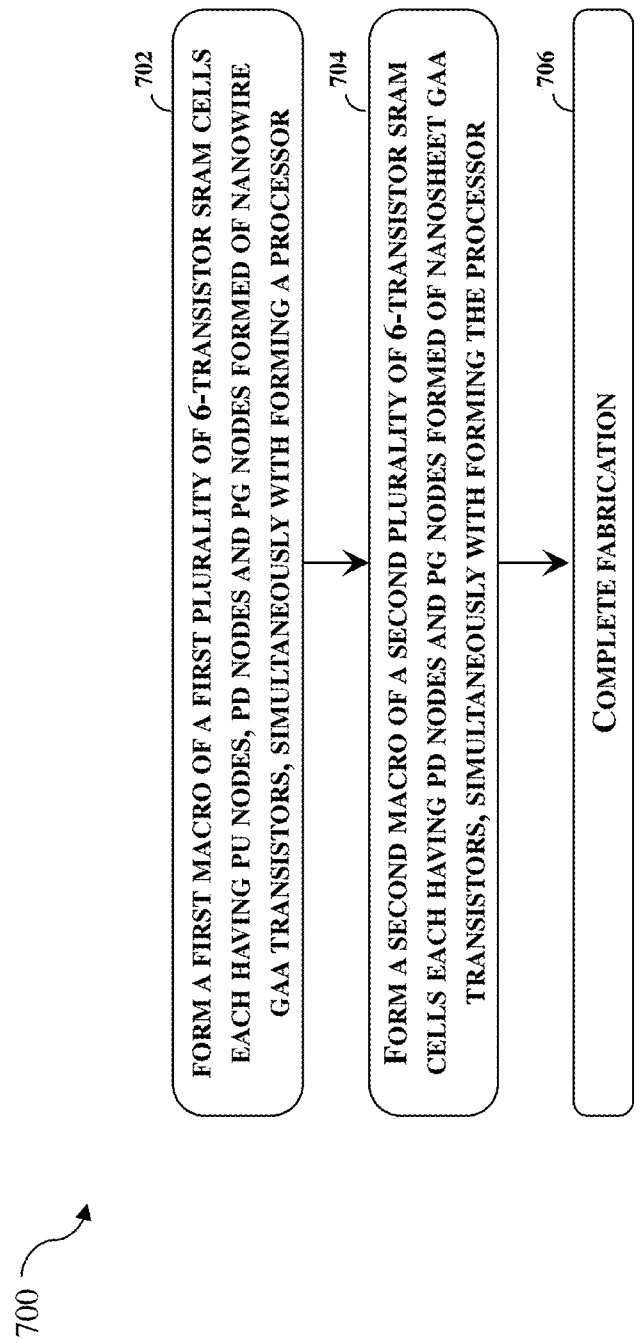
FIG. 7 is a flowchart illustrating a method of forming a memory structure according to an embodiment of the present disclosure.

FIG. 7 is a flowchart illustrating a method 700 of forming an embedded memory structure that includes macros formed of the first type SRAM cells 200 and the second type SRAM cells 300. The memory structure may be embedded in an SOC chip, a CPU, or a GPU. The method 700 is merely an example, and is not intended to limit the present disclosure beyond what is explicitly recited in the claims. Additional operations can be provided before, during, and after the method 700, and some operations described can be replaced, eliminated, or moved around for additional embodiments of the method 700. Operations of the method 700 will be described below conjunction with FIGS. 1, 2, 2A, 2B, 2C, 3, 3A, 4, 5, and 6.

At operation 702 of the method 700, a first macro is formed and the first macro includes of a first plurality of 6 transistor (6T) SRAM cells each having pull-up nodes, pull-down nodes, and pass-gate nodes formed of nanowire GAA transistors. The formation of the first macro (or at least a part thereof) is carried out simultaneously with formation of a processor, such as a CPU or a GPU. At operation 704, a second macro is formed and the second macro includes a second plurality of 6T SRAM cells each having pull-down nodes and pass-gate nodes formed of nanosheet GAA transistors and pull-up nodes formed of nanowire GAA transistors. The formation of the second macro (or at least a part thereof) is carried out simultaneously with formation of the processor. In embodiments where the first type and second type SRAM cells 200 and 300 are each formed over an N well sandwiched between two P wells, the pull-down nodes and pass-gate nodes of the first type and second type SRAM cells are N type GAA transistors. At operation 706, further operations are carried out to complete fabrication of the memory structure. Such further operations may include forming contact openings and vias to source/drain regions of the GAA transistors in SRAM cells 200 and 300, forming contact openings and vias to gate structures of in SRAM cells 200 and 300, forming metal line layers and intermetallic dielectric layers, and the like. Such further operations may also include forming the first peripheral circuits for the first type SRAM cells 200 and the second peripheral circuits for the second type SRAM cells 300.

Based on the above discussions, it can be seen that the present disclosure offers advantages over conventional SRAM cells and SRAM macros. It is understood, however, that other embodiments may offer additional advantages, and not all advantages are necessarily disclosed herein, and that no particular advantage is required for all embodiments. The present disclosure puts forth an embedded memory structure that integrates both the first type SRAM cell that includes nanowire GAA transistors as the pull-down, pass-gate and pull-up nodes and the second type SRAM cell that includes nanosheet GAA transistors as the pull-down and pass-gate nodes. In addition, the second type SRAM cells may have wider bit lines such that no write assist circuitry is required. The second type SRAM cells are suitable for high speed applications, such as L1 caches and the first type SRAM cells are suitable for non-speed critical, low leakage, and high density applications, such as L3 caches. The integration of the two types of SRAM cells provides design flexibility to achieve optimization in different environments and operation conditions.

The disclosure of the present disclosure provides embodiments of memory structures and SOC devices. In one embodiment, a memory structure is provided. The memory structure includes a first static random access memory (SRAM) macro comprising first gate-all-around (GAA) transistors, and a second SRAM macro comprising second GAA transistors. In this memory structure, the first GAA transistors of the first SRAM macro each comprises a first plurality of channel regions each having a first channel width (W1) and a first channel thickness (T1), and the second GAA transistors of the second SRAM macro each comprises a second plurality of channel regions each having a second channel width (W2) and a second channel thickness (T2). W2/T2 is greater than W1/T1. In some instances, the first GAA transistors are nanowire GAA transistors and the second GAA transistors are nanosheet GAA transistors.

In some embodiments, W1/T1 is between about 0.9 and about 2. In some embodiments, W2/T2 is between about 2 and about 10. In some implementations, W2/W1 is between about 1.2 and about 5.0. In some embodiments, the first SRAM macro is formed of a first plurality of first SRAM cells and the second SRAM macro is formed of a second plurality of second SRAM cells. Each of the second plurality of second SRAM cells has a width greater than a width of each of the first plurality of first SRAM cells. In some instances, the first plurality of first SRAM cells includes a first cell pitch and the second plurality of second SRAM cells includes a second cell pitch greater than the first cell pitch. In some implementations, a first plurality of bit line layers of the first SRAM macro has a first bit line width and a second plurality of bit line layers of the second SRAM macro has a second bit line width greater than the first bit line width. In some instances, the second bit line width is at least 1.2 times of the first bit line width.

In another embodiment, a static random access memory (SRAM) structure is provided. The SRAM structure includes a first six-transistor (6T) static random access memory (SRAM) macro including a first plurality of cells each having N-type first variety gate-all-around (GAA) transistors and P-type first variety GAA transistors, and a second 6T SRAM macro including a second plurality of cells each having N-type second variety GAA transistors and P-type first variety GAA transistors. The first variety GAA transistors each includes a first plurality of channel regions each having a first channel width (W1) and a first channel thickness (T1). The N-type second variety GAA transistors each includes a second plurality of channel regions each having a second channel width (W2) and a second channel thickness (T2). W2/T2 is greater than W1/T1. In some implementations, the first variety GAA transistors are nanowire GAA transistors and the second variety GAA transistors are nanosheet GAA transistors.

In some embodiments, each of the first plurality of cells of the first 6T SRAM macro includes a pass-gate node including one of the N-type first variety GAA transistors, a pull-down node including another of the N-type first variety GAA transistors, and a pull-up node including one of the P-type first variety GAA transistors. In these embodiments, each of the second plurality of cells of the second 6T SRAM macro includes a pass-gate node including one of the N-type second variety GAA transistors, a pull-down node including another of the N-type second variety GAA transistors, a pull-up node including one of the P-type first variety GAA transistors. In some implementations, W1/T1 is between about 0.9 and about 2. In some instances, W2/T2 is between about 2 and about 10. In some embodiments, W2/W1 is between about 1.4 and about 3.0. In some implementations, the first 6T SRAM macro is formed of a first plurality of first SRAM cells and the second 6T SRAM macro is formed of a second plurality of second SRAM cells, wherein each of the second plurality of second SRAM cells has a width greater than a width of each of the first plurality of first SRAM cells. In some implementations, the first plurality of first SRAM cells includes a first cell pitch and the second plurality of second SRAM cells includes a second cell pitch greater than the first cell pitch. In some instances, a first plurality of bit line layers of the first 6T SRAM macro has a first bit line width and a second plurality of bit line layers of the second 6T SRAM macro has a second bit line width greater than the first bit line width. In some embodiments, the second bit line width is at least 1.2 times of the first bit line width.

In a further embodiment, a SOC device is provided. The SOC device includes a processor, a first static random access memory (SRAM) macro comprising a first plurality of six-transistor (6T) SRAM cells, a second SRAM macro comprising a second plurality of 6T SRAM cells, and a third SRAM macro comprising a third plurality of 6T SRAM cells. The first, second and third macros are accessible by the processor. All of pull-down (PD) nodes and pass-gate (PG) nodes of each of the first plurality of 6T SRAM cells are vertically stacked first variety gate-all-around (GAA) transistors. All of pull-down (PD) nodes and pass-gate (PG) nodes of each of the second plurality of 6T SRAM cells are vertically stacked second variety GAA transistors. Pull-down (PD) nodes and pass-gate (PG) nodes of the third plurality of 6T SRAM cells include vertically stacked first variety GAA transistors and vertically stacked second variety GAA transistors. The vertically stacked first variety GAA transistors each includes a first plurality of channel regions each having a first channel width (W1) and a first channel thickness (T1). The vertically stacked second variety GAA transistors each includes a second plurality of channel regions each having a second channel width (W2) and a second channel thickness (T2). W2/T2 is greater than W1/T1. In some implementations, the first variety GAA transistors are nanowire GAA transistors and the second variety GAA transistors are nanosheet GAA transistors. In some embodiments, W1/T1 is between about 0.9 and about 2.0. In some implementations, W2/T2 is between about 2.0 and about 10.0.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit-line conductor and word line conductor, one can achieve different resistances for the conductors. However, other techniques to vary the resistances of the metal conductors may also be utilized as well.

What is claimed is:

1. A memory structure, comprising:
   an n-type device comprising a first plurality of nanostructures over a substrate and a first gate structure wrapping around the first plurality of nanostructures; and
   a p-type device comprising a second plurality of nanostructures and a second gate structure wrapping around the second plurality of nanostructures,
   wherein the first plurality of nanostructures each extend horizontally and lengthwise along a first direction parallel to a top surface of the substrate and are vertically stacked one over another,
   wherein the second plurality of nanostructures each extend horizontally and lengthwise along the first direction and are vertically stacked one over another,
   wherein in a vertical cross-sectional view across the first gate structure, the second gate structure, and each nanostructure of the first plurality of nanostructures and the second plurality of nanostructures, each nanostructure of the first plurality of nanostructures has a first width (W1), and each nanostructure of the second plurality of nanostructures has a second width (W2) smaller than the first width (W1).

2. The memory structure of claim 1,
   wherein each nanostructure of the first plurality of nanostructures has a first thickness (T1),
   wherein each nanostructure of the second plurality of nanostructures has a second thickness (T2),
   wherein a ratio of the first width to the first thickness (W1/T1) is greater than a ratio of the second width to the second thickness (W2/T2).

3. The memory structure of claim 2, wherein the first thickness (T1) is identical to the second thickness (T2).

4. The memory structure of claim 2, wherein W1/T1 is between about 2 and about 10.

5. The memory structure of claim 2, wherein W2/T2 is between about 0.9 and about 2.

6. The memory structure of claim 2, wherein W1/W2 is between about 1.2 and about 5.0.

7. The memory structure of claim 1, wherein the first gate structure is separated from the second gate structure by a gate end dielectric feature.

8. The memory structure of claim 7, wherein the gate end dielectric feature is disposed on a shallow trench isolation (STI) region.

9. The memory structure of claim 1,
   wherein the p-type device is a first p-type device,
   wherein the memory structure further comprises a second p-type device comprising a third plurality of nanostructures wrapped around by the second gate structure,
   wherein the second p-type device and the n-type device sandwich the first p-type device along a second direction perpendicular to the first direction, and
   wherein the second gate structure extends lengthwise along the second direction.

10. A memory structure, comprising:
    an n-type device comprising a first plurality of nanostructures over a substrate;
    a first p-type device comprising a second plurality of nanostructures; and
    a second p-type device comprising a third plurality of nanostructures,
    wherein the first plurality of nanostructures each extend horizontally and lengthwise along a first direction parallel to a top surface of the substrate and are vertically stacked one over another,
    wherein the second plurality of nanostructures each extend horizontally and lengthwise along the first direction and are vertically stacked one over another,
    wherein the third plurality of nanostructures each extend horizontally and lengthwise along the first direction and are vertically stacked one over another,
    wherein the second plurality of nanostructures are spaced apart from the third plurality of nanostructures along a second direction perpendicular to the first direction,
    wherein each of the first plurality of nanostructures has a first width (W1) and a first thickness T1,
    wherein each of the third plurality of nanostructures has a second width (W2) and a second thickness T2,
    wherein the first width (W1) and the second width (W2) are along the second direction, and
    wherein a ratio of the first width to the first thickness (W1/T1) is different from a ratio of the second width to the second thickness (W2/T2).

11. The memory structure of claim 10, where a distance between the first plurality of nanostructures and the second plurality of nanostructures is greater than a distance between the second plurality of nanostructures and the third plurality of nanostructures.

12. The memory structure of claim 10,
wherein the first plurality of nanostructures are disposed over a p-type well region of the substrate,
wherein the second plurality of nanostructures and the third plurality of nanostructures are disposed over an n-type well region of the substrate, and
wherein the first p-type device is disposed between the n-type device and the second p-type device along the second direction.

13. The memory structure of claim 10,
wherein the ratio of the first width to the first thickness (W1/T1) is greater than the ratio of the second width to the second thickness (W2/T2).

14. The memory structure of claim 10,
wherein the n-type device further comprises a first gate structure that wraps around each of the first plurality of nanostructures,
wherein the first p-type device and the second p-type device share a second gate structure that wraps around each of the second plurality of nanostructures and each of the third plurality of nano structures.

15. The memory structure of claim 14, wherein the first gate structure is separated from the second gate structure by a gate end dielectric feature.

16. A memory device, comprising:
a first lateral gate-all-around (GAA) transistor comprising a plurality of first nanostructures extending horizontally and stacked vertically one over another; and
a second lateral GAA transistor comprising a plurality of second nanostructures extending horizontally and stacked vertically one over another,
wherein each of the plurality of first nanostructures has a first width (W1) and a first thickness (T1),
wherein each of the plurality of second nanostructures has a second width (W2) smaller than the first width (W1) and a second thickness (T2),
wherein a ratio of the first width to the first thickness (W1/T1) is greater than a ratio of the second width to the second thickness (W2/T2).

17. The memory device of claim 16, further comprising a third lateral GAA transistor comprising a plurality of third nano structures extending horizontally and stacked vertically one over another, wherein each of the plurality of third nanostructures has the second width (W2).

18. The memory device of claim 17,
wherein the first thickness T1 is identical to the second thickness T2,
wherein the first thickness T1 is identical to a third thickness of each of the plurality of third nanostructures.

19. The memory device of claim 17,
wherein the first lateral GAA transistor further comprises a first gate structure that wraps around each of the plurality of first nanostructures,
wherein the second lateral GAA transistor and the third lateral GAA transistor share a second gate structure that wraps around each of the plurality of second nanostructures and each of the plurality of third nanostructures.

20. The memory device of claim 19, wherein the first gate structure is separated from the second gate structure by a gate end dielectric feature.

\* \* \* \* \*